United States Patent
Lim et al.

(10) Patent No.: US 9,431,582 B2
(45) Date of Patent: Aug. 30, 2016

(54) PACKAGING METHOD AND SYSTEM FOR LEDS

(75) Inventors: Michael Lim, Lexington, MA (US); Paul Joseph Panaccione, Newburyport, MA (US); Aaron Breen, Needham, MA (US); Michael Hadley, Pepperell, MA (US)

(73) Assignee: Luminus Devices, Inc., Billerica, MA (US)

( * ) Notice: Subject to any disclaimer, the term of this patent is extended or adjusted under 35 U.S.C. 154(b) by 211 days.

(21) Appl. No.: 13/468,227

(22) Filed: May 10, 2012

(65) Prior Publication Data

US 2013/0175551 A1 Jul. 11, 2013

Related U.S. Application Data

(60) Provisional application No. 61/584,207, filed on Jan. 6, 2012.

(51) Int. Cl.
| | |
|---|---|
| *H01L 21/00* | (2006.01) |
| *H01L 23/495* | (2006.01) |
| *H01L 33/48* | (2010.01) |
| *H01L 33/62* | (2010.01) |

(52) U.S. Cl.
CPC ............ *H01L 33/486* (2013.01); *H01L 33/62* (2013.01); *H01L 2924/0002* (2013.01)

(58) Field of Classification Search
CPC .................................................. H01L 33/486
USPC ......... 257/668, 698, 784, E23.141–E23.179; 438/121–124
See application file for complete search history.

(56) References Cited

U.S. PATENT DOCUMENTS

| | | | | |
|---|---|---|---|---|
| 6,661,081 B2 * | 12/2003 | Miyaki et al. | ................ | 257/668 |
| 7,938,561 B2 * | 5/2011 | Suehiro et al. | .......... | 362/249.02 |
| 8,514,345 B2 * | 8/2013 | Onoue et al. | ................. | 349/58 |
| 2012/0241773 A1 * | 9/2012 | Chang et al. | ................... | 257/88 |

* cited by examiner

*Primary Examiner* — Calvin Lee (57) ABSTRACT

A slim LED package configured to handle large current, having a narrow width, an LED chip mounting area positioned centro-symmetrically within the package, mounting holes positioned equidistantly from the mounting area, wherein multiple packages may be arranged with alternating anode and cathode ends in such a manner that a high-power density radiometric flux line may be created. Some embodiments include current density management areas positioned on one more sides of the LED chip mounting area.

12 Claims, 8 Drawing Sheets

PACKAGING METHOD AND SYSTEM FOR LEDS

CROSS-REFERENCE TO RELATED APPLICATIONS

This application claims priority under 35 U.S.C. §119 to the following U.S. Provisional Patent Application of which is hereby incorporated by reference in its entirety: U.S. Ser. No. 61/584,207 filed Jan. 6, 2012.

COPYRIGHT STATEMENT

A portion of the disclosure of this patent application document contains material that is subject to copyright protection including the drawings. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

1. Field of the Invention

The present embodiments relate generally to LED packaging and more particularly to high-density LED packaging used in line curing applications.

2. Description of the Prior Art

Industrial curing systems require large areas of high optical-power density. The traditional source of this high power radiation has been mercury lamps. Recently, there has been a strong drive to transition from mercury lamps to UV LEDs. To meet the power density requirement, integrators of curing systems have resorted to placing many small chips in close proximity. This solution has the traditional liabilities of arrayed systems, i.e., increased system complexity and decreased reliability. A replaceable universal modular big-chip approach can ease the overall system integration challenges by using fewer devices that can be replaced in the event of a failure.

The following application seeks to solve the problems stated.

SUMMARY OF THE INVENTION

The embodiments described herein refer to a "slim" package that contains features that enable the placing of big-chip devices into close-packed arrays. One of the embodiments, disclosed herein, introduces additional trace length on a first side of the package to help balance the resistance ratio on either side of the LED chip mounting area of the package.

One LED package comprises a substrate having a length longer than a width, an electrical trace layer mounted to the substrate, and a dielectric layer electrically separating the electrical trace layer and the substrate. The electrical trace layer contains a mounting area configured to mount an LED chip, which is centro-symmetrically placed in the package, so as to create the ability to rotate the package about the mounting area. The electrical trace layer, dielectric layer and substrate contain two alignment holes that are positioned substantially equidistant on either side of the mounting area. A mounted LED chip may be electrically connected to the electrical trace layer and the substrate layer, which may act as an electrical ground.

DETAILED DESCRIPTION OF THE PREFERRED EMBODIMENT

Figure 5:
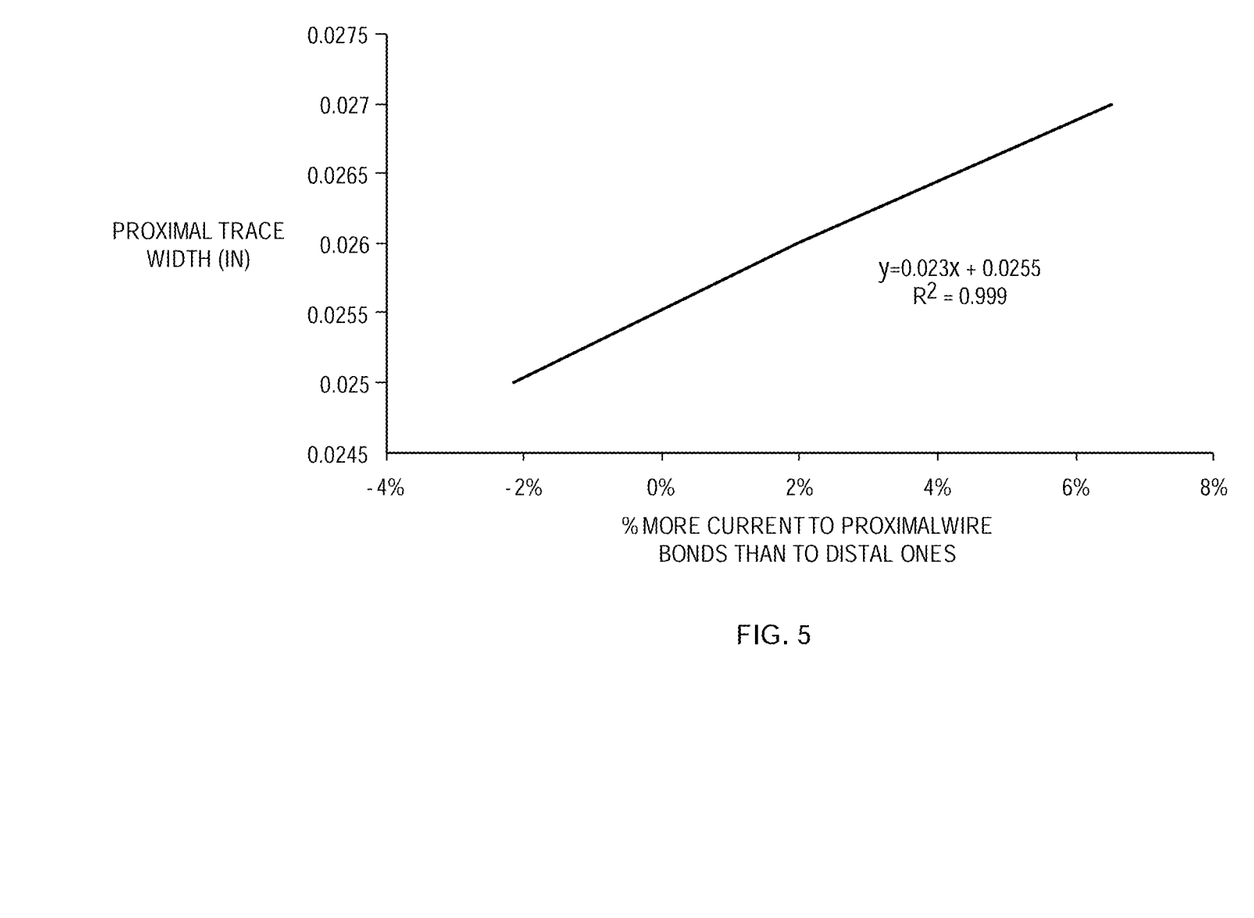
FIG. 5 is a graph illustrating current imbalance between proximal and distal wire bonds when modifying the trace width incorporated into a current density management region such as one shown in FIG. 3B.

Aspects and embodiments described herein relate generally to the field of packaging LED devices. The following describes a slim package LED design configured to decrease the imbalance of conductivity between electrodes on the proximal and distal ends of an LED chip. By reducing the resistance created by narrow traces, current flow becomes more balanced on either side of the LED chip and reduces any non-uniformity in the emission that may have resulted from an imbalance in current. This balancing of current flow and reduction in resistance along the narrow traces is accomplished by integrating a region of narrowing and/or additional trace length that balances the voltage drop as comparatively illustrated in FIGS. 3A-B. A graph demonstrating optimal trace widths for one embodiment described herein is shown in FIG. 5.

Some of the advantages of using large chip LEDs may include: efficiency, increase lumen output, and simpler design. Often-times arrays of smaller LED chips are combined in order to achieve a sufficient amount of lumen output. However, it may be more difficult and complex to achieve the same radiometric flux properties, such as a continuous line of high density flux intensities with a plurality of smaller LED chips tightly packed. In addition, simpler 'plug-and-play' solutions are desirable to keep maintenance low, downtime reduced, to increase capacity, and profitability. For these and other reasons, a flexible packaging system having a centro-symmetric is desirable and described herein.

One industry that can benefit from high output, high lumen large chip LEDs is the curing industry, which continues to incorporate xenon mercury lamps. Mercury lamps are less efficient light sources because of their inherent etendue properties, hazardous, expensive and relatively short lifespans. Ultraviolet (UV) emitting large chip LEDs, such as those produced by Luminus Devices, have better etendue properties, which allows for simpler optical systems, longer lifespan and are devoid of mercury. Additionally, LEDs also generally handle duty cycling better than xenon mercury arc lamps and have the ability to turn instantly on and off.

Figure 1A:
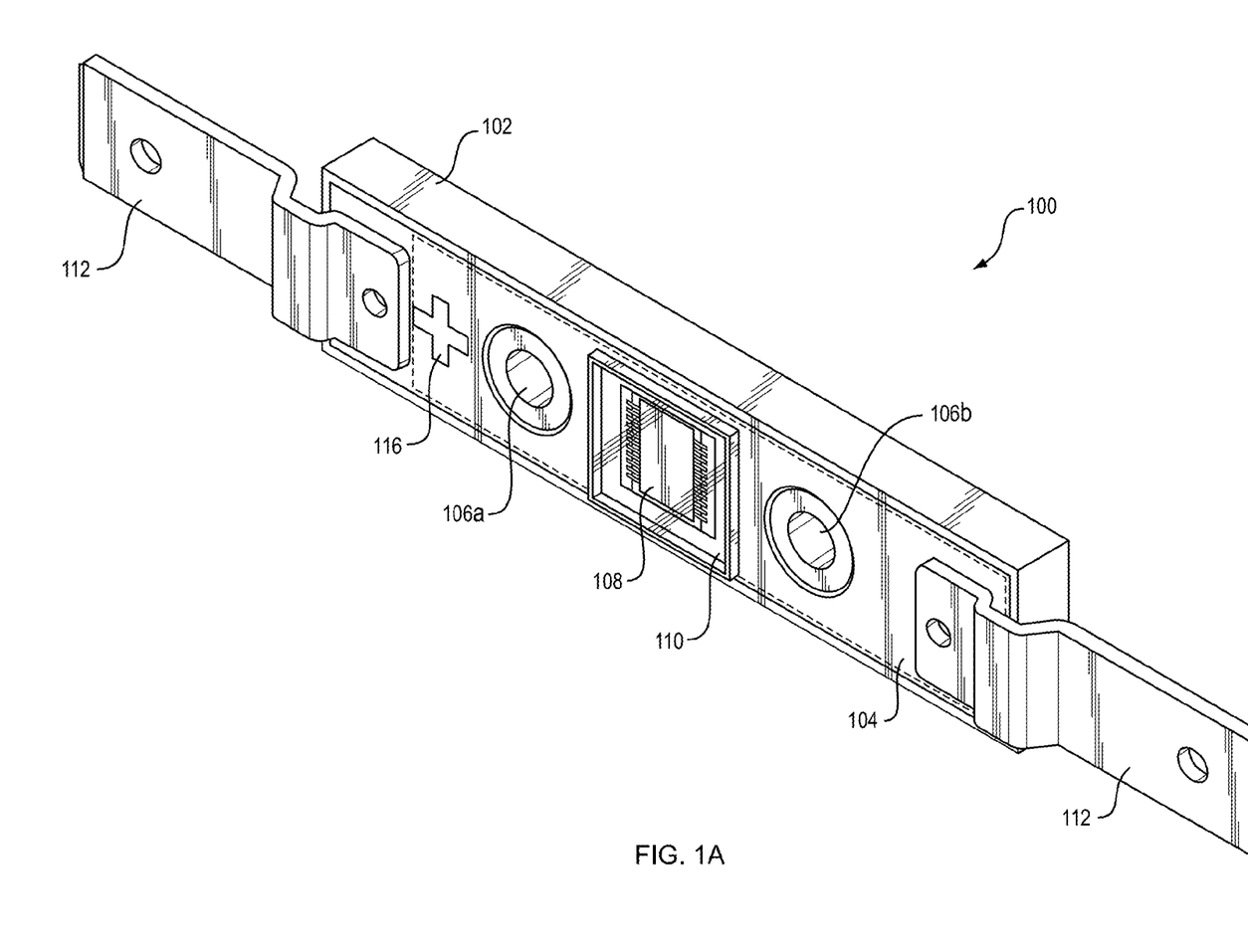
FIGS. 1A-F illustrate various perspective views of one embodiment of a LED package having a centro-symmetric LED mounting area.

As a result, the LED package design embodiments, as described herein, seek to take advantage of the inherent properties of large chip UV LEDs. FIGS. 1A-F illustrate various perspective views of a narrow LED package system 100. An isometric view of LED package system 100 is shown in FIG. 1A. Here, system 100, is comprised of the substrate 102, which may comprise one of a variety of thermally and/or electrically conductive materials. Some of these materials include copper and aluminum. Generally, substrate 102 acts as a ground and as a thermal heat sink for LED 108. A multi-layered board 104 is mounted on top of substrate 102. The multi-layered board 104 may be comprised of a dielectric material that separates the substrate 102 from an electrical trace layer configured to bring an electric current to LED 108. Another dielectric layer may also be placed on top of the electrical trace layer of the multi-layered board 104. In some embodiments, a protective window 110 covers LED 108. Marking features such as the positive sign 116 may be formed on top of the multi-layer board 104 to illustrate which end of the package is the positive or cathode lead as opposed to the negative or anode lead.

As shown, large connectors 112 are placed on each end of the LED package system 100. These large and wide connectors are useful when a large amount of current is required. For instance, some of these large chip LEDs may handle upwards of 40 amps or more. However, connectors 112 are not necessary in all embodiments. Also shown in embodiment 100, are holes 106A-B, which pass through both the substrate 102 and multilayer board 104. These holes are ideal for mounting the LED package 100 into a system, such as a UV line curing system.

Figure 1B:
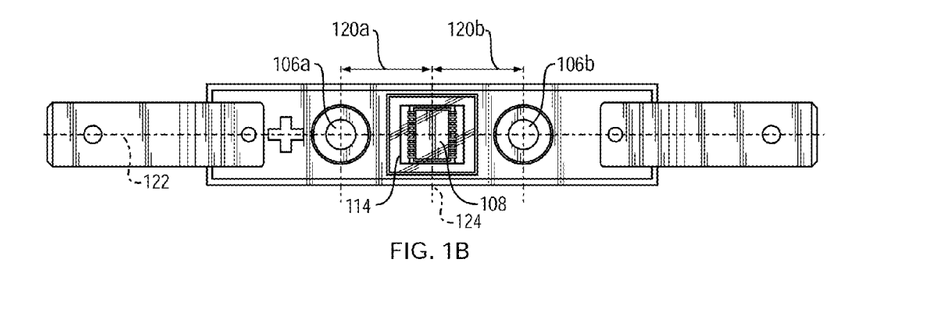
Figure 1C:
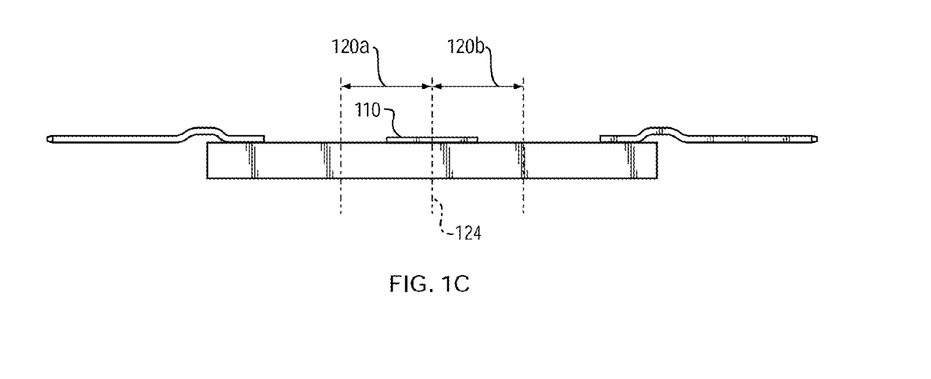
Figure 1D:
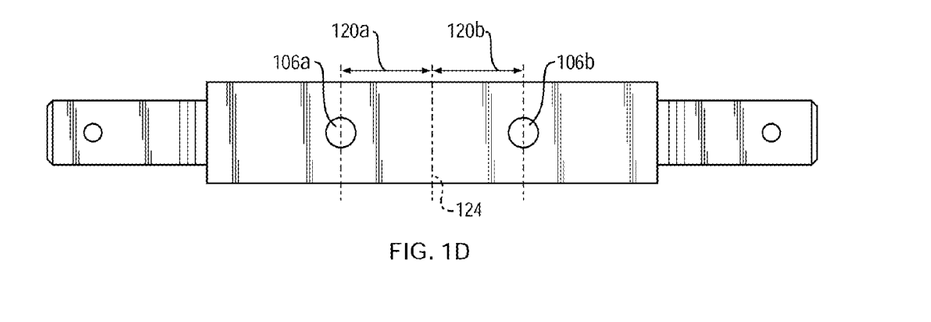
Figure 2:
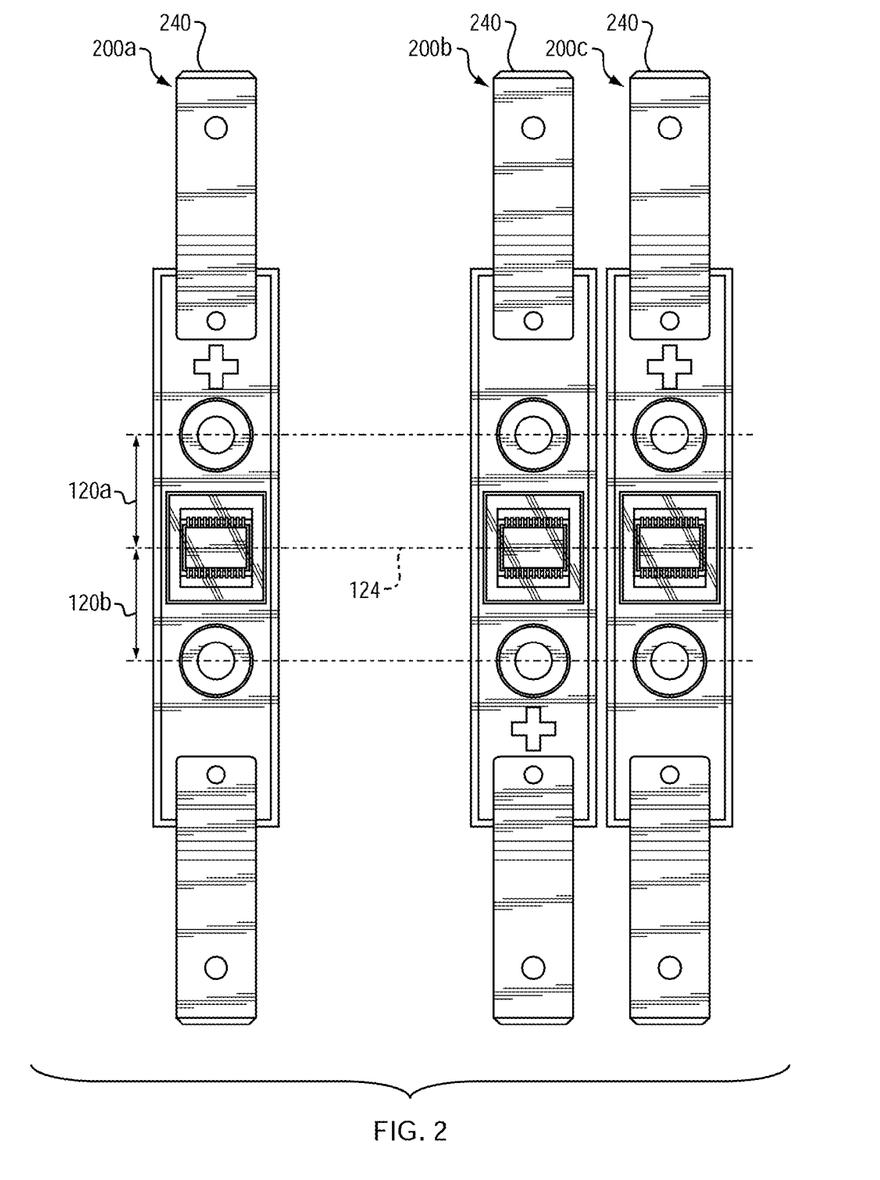
FIG. 2 is a linear configuration of a plurality of centro-symmetrical LED packages aligned in an array, wherein a line of radiometric flux may be produced.

FIG. 1B illustrates a top view of LED package 100 and shows the equidistant placement of holes 106A-B with respect to LED 108. As shown, distances 120A and 120b are substantially equal within machining tolerances known in the art for this particular type of application. Additionally, holes 106A-B are centered along the central axis 122 of LED package 100. LED 108 is also centered on the LED package 100 along centerline 124. FIG. 1C illustrates a side view of 100. FIG. 1D illustrates a bottom view of 100. This centro-symmetrical design allows for a few advantages, namely, LED package 100 may be rotated about the center of the package 100 by 180 degrees and the LED 108, which is located at this position continues to be in the same location. FIG. 2 helps illustrate this concept. This rotational ability and the 'plug and play' design allow for a plurality of these packages to be aligned side-by-side and powered either in series or in parallel.

Figure 1E:
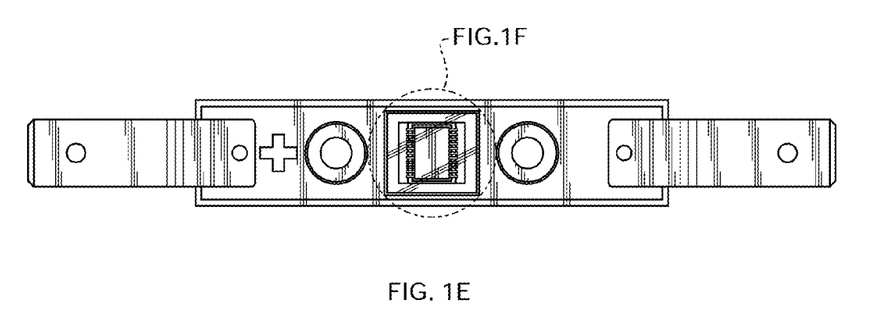
Figure 1F:
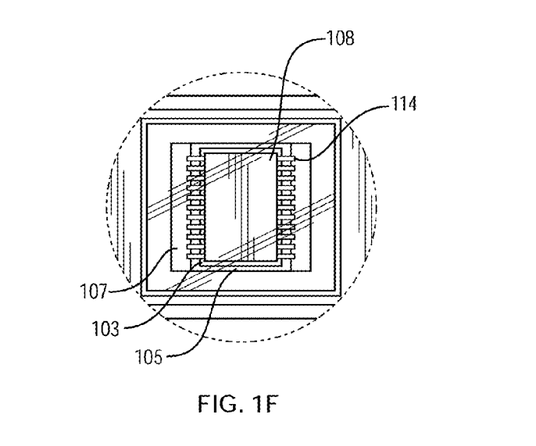

FIG. 1E is a top-view embodiment of a slim LED package. FIG. 1F illustrates an enlarged view of the LED mounting area of FIG. 1E. FIG. 1F further demonstrates the relationship between LED 108 and the layers of the multi-layered board (not labeled in FIG. 1F). In at least one embodiment, as shown in FIG. 1F, the multi-layered board comprises a plurality of layers, including a substrate/conductive layer 103, a dielectric layer 105 and an electric trace layer 107. Wire bonds 114 connect LED 108 to the electric trace layer 107 at proximal and distal sides of the mounting area.

FIG. 2 illustrates a linear configuration of a plurality of LED packages 200a, 200b and 200c. Again, because of the centro-symmetric design, the alignment of the LEDs is not effected when one package is rotated by 180 degrees, such as package 200b which is aligned at a 180 degree offset from packages 200a and 200c. This rotating of each LED package allows the cathode and anode leads to be electrically connected 240 in series, which has several advantages known in the art. These LED packages may also be run in parallel if that is desired. Holes 106a and 106b (not labeled in FIG. 2) will still align and mount in the correct position in a UV line curing system when rotating about by 180 degrees. This mounting alignment allows each package to be individually replaceable in a line curing system that may comprise of tens or hundreds or more of these LED packages arranged side-by-side.

In order to create a more uniform radiometric flux line curing system, the width of the packages must be as narrow as possible, so that each LED 108 may be placed as close together as feasible. As a result, this narrow-width design creates narrow traces on one or both sides of the LED 108 where it is mounted to multi-layer board 104 and substrate 102 in a mounting area. This mounting area includes the bottom of the LED to be grounded to the substrate and may include an opening or window in the multi-layer board 104. Wire bonds 114, as shown in FIG. 1B, connect LED 108 to the proximal and distal sides of the mounting area.

Figure 3A:
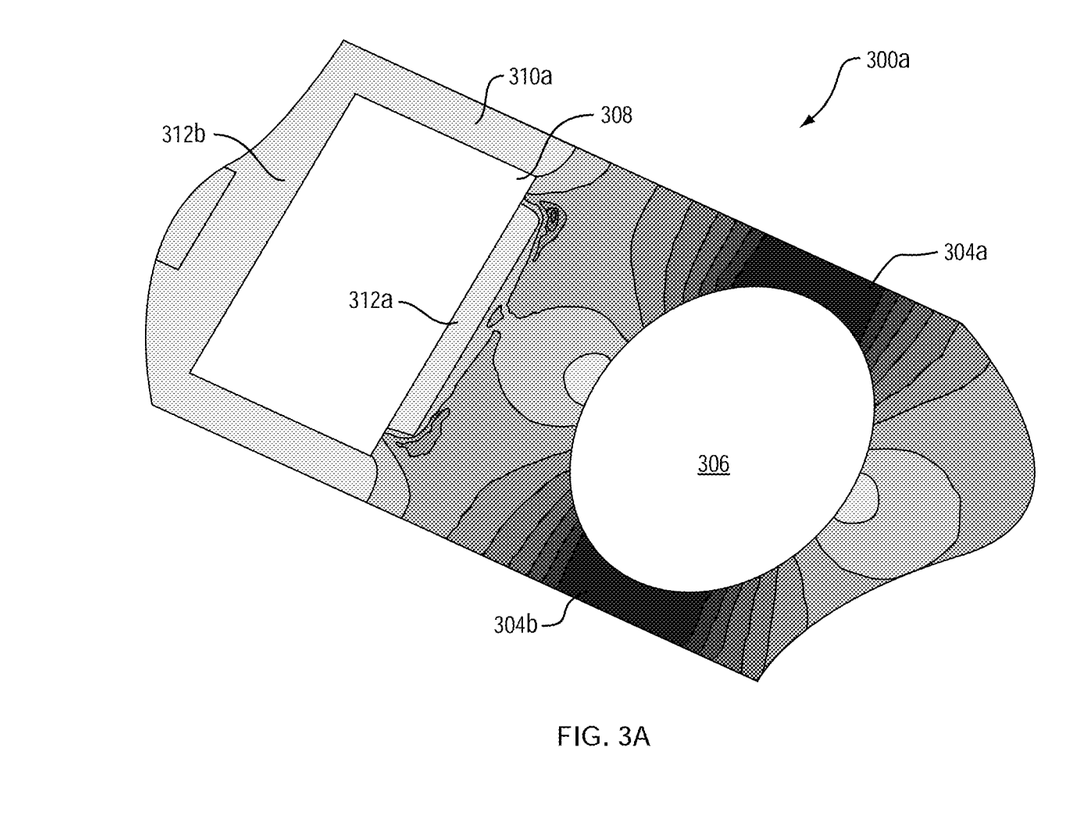
FIGS. 3A-B demonstrate current density differences in a portion of an electrical trace design used in the LED packages described herein where one electrical trace design is without a current density stabilization region and management region.
Figure 3B:
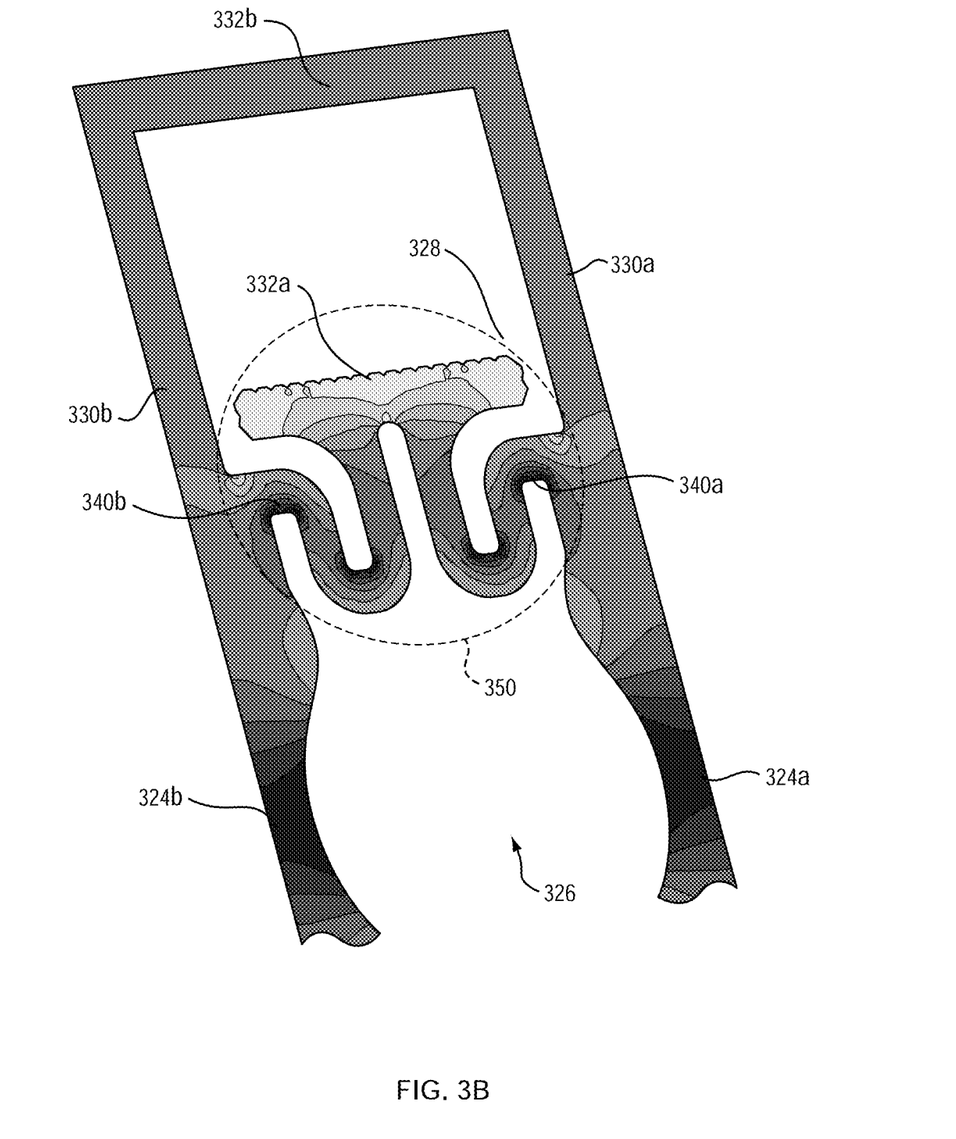

FIGS. 3A-B comparatively illustrate electrical trace layers with and without a current density stabilization region. For instance, as shown in FIG. 3A, a current density analysis of a portion of an electrical trace layer 300a is shown. The resistance difference between the proximal bonding pad 312a and the distal bonding pad 312b is approximately a factor of 48×. Electrical trace layer 300a includes a hole 306 that aligns with the hole in the substrate and a window or opening 308 in the LED mounting area. Trace paths 304a and 304b exhibit increased resistance due to the narrowing of the trace width in those respective areas. Trace paths 310a and 310b help deliver current to distal bond pad 312b.

Alternatively, FIG. 3B likewise illustrates a current density analysis of a portion of an electrical trace layer 300b, which incorporates the current density stabilization region 350. The resulting current imbalance on each side of the mounting area through proximal bond pad 332a and distal bond pad 332b is approximately 0.27% as analyzed. By increasing the length of trace paths 340a and 340b while also narrowing each of these trace paths the resistance is increased enough on the proximal side to allow for a balancing of the current on both sides of the mounting area. Furthermore, the current density stabilization region also allows the overall width of the electrical trace layer 300b, as well as trace paths 330a and 330b, to be as narrow as possible. Similar to above, a hole 326 is incorporated in the electrical trace layer 300b for mounting purposes and an opening 328 in the mounting area to allow for an LED to be electrically grounded as well as thermally connected to a substrate.

Figure 4:
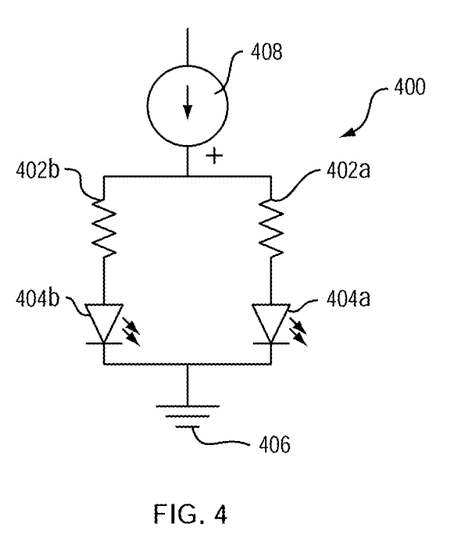
FIG. 4 is electrical schematic illustrating the resistance across top leads and side leads in an embodiment of an LED package.

FIG. 4 illustrates an electrical schematic 400 of what occurs in one of the LED package embodiments described herein. Current 408 is flowing parallel through resistance 402a, which represents the proximal side of the LED and 402b, which represents the distal side of the LED into the proximal portion 404a and distal portion 404b of a surface emitting LED, while the bottom of the LED is connected to ground 406. By matching the resistivity of 402a and 402b the current imbalance is reduced. In most cases the current imbalance is less than about 5%, and less than about 1%, depending on the tolerance of the LED. Additionally, the tolerance of the LED will in part determine the appropriate current imbalance tolerated before uniformity, lifespan or other possible negative effects that current imbalance may have on the system, occur.

FIG. 5 illustrates a variety of individual trace widths for paths such as 340a and 340b shown in FIG. 3B that will lead to a more balanced current flow on each of the LED in the system.

Thus, narrow traces created in an electrical trace layer are a result of a narrow width LED packages. The narrow-width packages are desirable to keep a row of LEDs packed as closely together as possible. The tight packing in turn allows for the creation of an optical line with high density radiometric flux, which is very useful in curing systems. The windows allow the LED chip to be connected to a heat dissipative system as well as ground. By creating a longer and or narrower trace pathway such as discussed above, resistance is increased, the potential voltage drop is managed, current imbalance is reduced and the non-uniformity is decreased while maintaining a slim package that is readily configured into a high density line optical system.

Other embodiments include centro-symmetrically placing two, three or more LEDs in a single package with substantially equidistance mounting holes. The mounting holes in each embodiment do not always have to be equally spaced from the centro-symmetrically placed LED(s). However, by doing so, it allows for a simpler mounting system to be created. It is contemplated that only one mounting hole may be used or no mounting holes, but instead mounting tabs or another securing means commonly used in the art. For example, it is contemplated, and consistent with the present disclosure, that clips, arms, posts, or levers may also be used to secure the narrow-width LED packages. By aligning the LEDs to be centro-symmetrically located in the package further advantages, such as those discussed above, are available.

Other embodiments include designs that have a common anode, isolated anode, and multiple LED isolated anode configuration. Large-chip LEDs are those having an emitting surface area greater than 1 mm$^2$. The overall shape of the LED packages described herein are generally oblong or rectangular having one length of the package longer than the width of the package. It is contemplated that the length-to-width-ratio may range from about 2:1 to 6:1. In at least one embodiment, the length-to-width ratio is about 3:1, while in other embodiments the ratio is about 4:1, and in other embodiments the ratio about 5:1. Additional ratios may also be in accordance with the present disclosure where the length of the package is longer than the width of the package. An oblong or rectangular shape is ideal to spread heat, while maintaining the ability to closely pack each package together in a single line or multi-line array, wherein the protective windows do not block the optical spread of each of the emitting LEDs. As mentioned, this line system is useful for UV curing systems, but it is within the scope to use any number of wavelengths emitted by LEDs for lighting, heating, curing or other systems wherein a line array delivering high-density radiometric flux is sought for.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming an optical line emitting LED curing system including the step of arranging a plurality of LED packages side-by-side with each LED package including:
    a substrate having a length longer than a width;
    an electrical trace layer mounted to the substrate; and
    a dielectric layer electrically separating the electrical trace layer and the substrate,
    wherein the electrical trace layer contains an LED mounting area,
    wherein two substantially equidistant holes positioned on a proximal and distal side of the LED mounting area are formed through the substrate, the dielectric layer, and the electrical trace layer, and
    wherein each LED package includes a single mounted LED that is centro-symmetrically arranged with respect to the two holes and is centro-symmetrically positioned with the length and width of the substrate.

2. The method of claim 1, wherein the LED packages further include a protective window covering the mounted LED.

3. The method of claim 2, wherein the viewing angle of the LED is unobstructed by the protective window.

4. The method of claim 1, wherein the substantially equidistant holes are aligned along the length of the substrate.

5. A packaged LED comprising:
    a substrate having a length longer than a width;
    an electrical trace layer mounted to the substrate;
    a dielectric layer electrically separating the electrical trace layer and the substrate, wherein the electrical trace layer contains a mounting area that is centro-symmetrically positioned with the length and width of the substrate, wherein the mounting area is configured to mount an LED chip, and wherein the electrical trace layer, dielectric layer and substrate contain two alignment holes that are positioned on either side of the mounting area; and
    an LED chip mounted on the mounting area, wherein the packaged LED includes a single LED chip that is centro-symmetrically positioned with the length and width of the substrate and with respect to the two alignment holes.

6. The LED package of claim 1, wherein the mounting area contains an opening exposing the substrate surface and wherein the mounting area is wider than 50 percent of the width of the substrate.

7. The LED package of claim 1, wherein a mounted LED Chip is centro-symmetrically positioned with the substrate, electrical trace layer, and dielectric layer.

8. The LED package of claim 1, wherein the two alignment holes are positioned substantially equidistant on either side of the mounting area.

9. An LED line curing system comprised of a plurality of LED packages arranged side-by-side, wherein each package includes:
    a substrate having a length longer than a width,
    an electrical trace layer mounted to the substrate;
    a dielectric layer electrically separating the electrical trace layer and the substrate,
    wherein the electrical trace layer contains a mounting area centro-symmetrically positioned with the substrate, the dielectric layer, and the electrical trace layer,
    wherein the mounting area is configured to mount an LED,
    wherein the substrate, the dielectric layer, and the electrical trace layer contain two alignment holes that are positioned on either side of the mounting area;
    an LED chip mounted on the mounting area, wherein each LED package includes a single LED chip that is centro-symmetrically positioned with the length and width of the substrate and with respect to the two alignment holes.

10. An LED line curing system comprised of a plurality of LED packages arranged side-by-side, wherein each package includes:
  a substrate having a length longer than a width;
  an electrical trace layer mounted to the substrate;
  a dielectric layer electrically separating the electrical trace layer and the substrate,
  wherein the electrical trace layer contains a mounting area centro-symmetrically positioned with the substrate, the dielectric layer, and the electrical trace layer,
  wherein the mounting area is configured to mount an LED,
  wherein the substrate, the dielectric layer, and the electrical trace layer contain two alignment holes that are positioned on either side of the mounting area; and
  anode and cathode leads extending from proximal and distal ends of each LED package, and wherein each LED package is centro-symmetrically aligned about a mounted LED chip such that when each package is rotated about 180 degrees the cathode lead of one LED package juxtaposes the anode lead of another LED package, and the plurality of packages forms an optical line from the centro-symmetrically aligned LED chips wherein radiometric flux is emitted.

11. The LED line curing system of claim 10, wherein a plurality of LED chips are centro-symmetrically mounted to each LED package, and wherein the optical line formed is comprised of a plurality of sub-optical lines with each emitting radiometric flux that overlaps in part to form a broad optical line.

12. The LED line curing system of claim 10, wherein the two alignment holes are positioned substantially equidistant on either side of the mounting area.

* * * * *